(12) United States Patent
Toh et al.

(10) Patent No.: US 12,327,776 B1
(45) Date of Patent: Jun. 10, 2025

(54) HEAT SINK FOR FACE BONDED SEMICONDUCTOR DEVICE

(71) Applicant: GlobalFoundries Singapore Pte. Ltd., Singapore (SG)

(72) Inventors: Rui Tze Toh, Singapore (SG); Anupam Dutta, Kolkata (IN); Oscar D. Restrepo, Halfmoon, NY (US); Vibhor Jain, Clifton Park, NY (US); Vvss Satyasuresh Choppalli, Bengaluru (IN); John J. Pekarik, Underhill, VT (US); Alexander Derrickson, Malta, NY (US)

(73) Assignee: GlobalFoundries Singapore Pte. Ltd., Singapore (SG)

(*) Notice: Subject to any disclaimer, the term of this patent is extended or adjusted under 35 U.S.C. 154(b) by 0 days.

(21) Appl. No.: 18/617,971

(22) Filed: Mar. 27, 2024

(51) Int. Cl.
| | | |
|---|---|---|
| H01L 23/367 | (2006.01) | |
| H01L 23/00 | (2006.01) | |
| H01L 23/522 | (2006.01) | |
| H10D 86/00 | (2025.01) | |

(52) U.S. Cl.
CPC ........ *H01L 23/367* (2013.01); *H01L 23/5226* (2013.01); *H01L 24/08* (2013.01); *H01L 24/80* (2013.01); *H10D 86/201* (2025.01); *H01L 2224/08145* (2013.01); *H01L 2224/80895* (2013.01); *H01L 2224/80896* (2013.01)

(58) Field of Classification Search
CPC ... H01L 23/367; H01L 23/5226; H01L 24/08; H01L 24/80; H01L 27/1203; H01L 2224/08145; H01L 2224/80895; H01L 2224/80896; H10D 86/201
See application file for complete search history.

(56) References Cited

U.S. PATENT DOCUMENTS

| | | | |
|---|---|---|---|
| 8,466,054 B2 * | 6/2013 | Stuber | H01L 23/36 438/599 |
| 2015/0146447 A1 * | 5/2015 | Kuepper | F21S 41/192 362/249.02 |
| 2024/0145363 A1 * | 5/2024 | Sridharan | H01L 24/16 |

FOREIGN PATENT DOCUMENTS

JP        5801300 B2      10/2015

\* cited by examiner

*Primary Examiner* — Khaja Ahmad
*Assistant Examiner* — Khatib A Rahman

(57) ABSTRACT

A semiconductor device includes a first substrate, a second substrate bonded to the first substrate, and at least one thermally conductive structure that extends through a portion of the first substrate and a portion of the second substrate and is vertically aligned with an active region of the first substrate. The at least one thermally conductive structure is electrically insulated from electrically active structures in the semiconductor device. The thermally conductive structure acts as a heat sink to transfer heat from the active region.

17 Claims, 6 Drawing Sheets

HEAT SINK FOR FACE BONDED SEMICONDUCTOR DEVICE

BACKGROUND

Heat dissipation is an important aspect in the design of semiconductor devices. Power used by semiconductors creates heat, which must be removed from the device, but how to do this efficiently is a growing challenge. The challenge is increasing as semiconductor devices become more highly integrated, handle higher amounts of power, and is especially acute for three-dimensional integrated circuits in which two or more chips are stacked on one another.

Interlayer dielectric materials tend to have low thermal conductivity. For example, silicon dioxide has a thermal conductivity of around 1 W/mK, which limits the extent to which heat generated in the active layer of the chip can dissipate. When two chips are stacked and one of the chips retains a bulk substrate material, the active layer of that chip is thermally bounded by the substrate material on one side and two stacks of interlayer dielectric material on the other side. This can lead to excessive heat build-up at the active layer, limiting the performance of the chip and possibly leading to errors or failure.

SUMMARY

Embodiments of the present application relate to a semiconductor device, a heatsink for a semiconductor device, and a method for forming a semiconductor device.

In an embodiment, a semiconductor device includes a first substrate, a second substrate bonded to the first substrate, and at least one thermally conductive structure that extends through a portion of the first substrate and a portion of the second substrate and is vertically aligned with an active region of the first substrate, and the at least one thermally conductive structure is electrically insulated from electrically active structures in the semiconductor device.

In an embodiment, a heat sink for a semiconductor device includes at least one thermally conductive structure that extends through a portion of a first substrate and a portion of a second substrate and is vertically aligned with an active region of the first substrate, wherein the at least one thermally conductive structure is electrically insulated from electrically active structures in the semiconductor device.

In an embodiment, a method for forming a semiconductor device includes forming a first portion of at least one thermally conductive structure in a first substrate, forming a second portion of at least one thermally conductive structure in second substrate, and bonding the first substrate to the second substrate so that the first portion of the at least one thermally conductive structure is thermally coupled to the second portion of the at least one thermally conductive structure, wherein the at least one thermally conductive structure is electrically insulated from electrically active structures in the semiconductor device.

DETAILED DESCRIPTION

Embodiments of the present disclosure relate to a semiconductor device with heat sink elements. In particular, embodiments relate to a semiconductor device with two face bonded substrates and thermally conductive structures that extend through BEOL portions of the two face bonded substrates.

A detailed description of embodiments is provided below along with accompanying figures. The scope of this disclosure is limited by the claims and encompasses numerous alternatives, modifications and equivalents. Although steps of various processes are presented in a given order, embodiments are not necessarily limited to being performed in the listed order. In some embodiments, certain operations may be performed simultaneously, in an order other than the described order, or not performed at all.

Numerous specific details are set forth in the following description. These details are provided to promote a thorough understanding of the scope of this disclosure by way of specific examples, and embodiments may be practiced according to the claims without some of these specific details. Accordingly, the specific embodiments of this disclosure are illustrative, and are not intended to be exclusive or limiting. For the purpose of clarity, technical material that is known in the technical fields related to this disclosure has not been described in detail so that the disclosure is not unnecessarily obscured. The figures are not drawn to scale, and features are enlarged or diminished for visual clarity.

Figure 1:
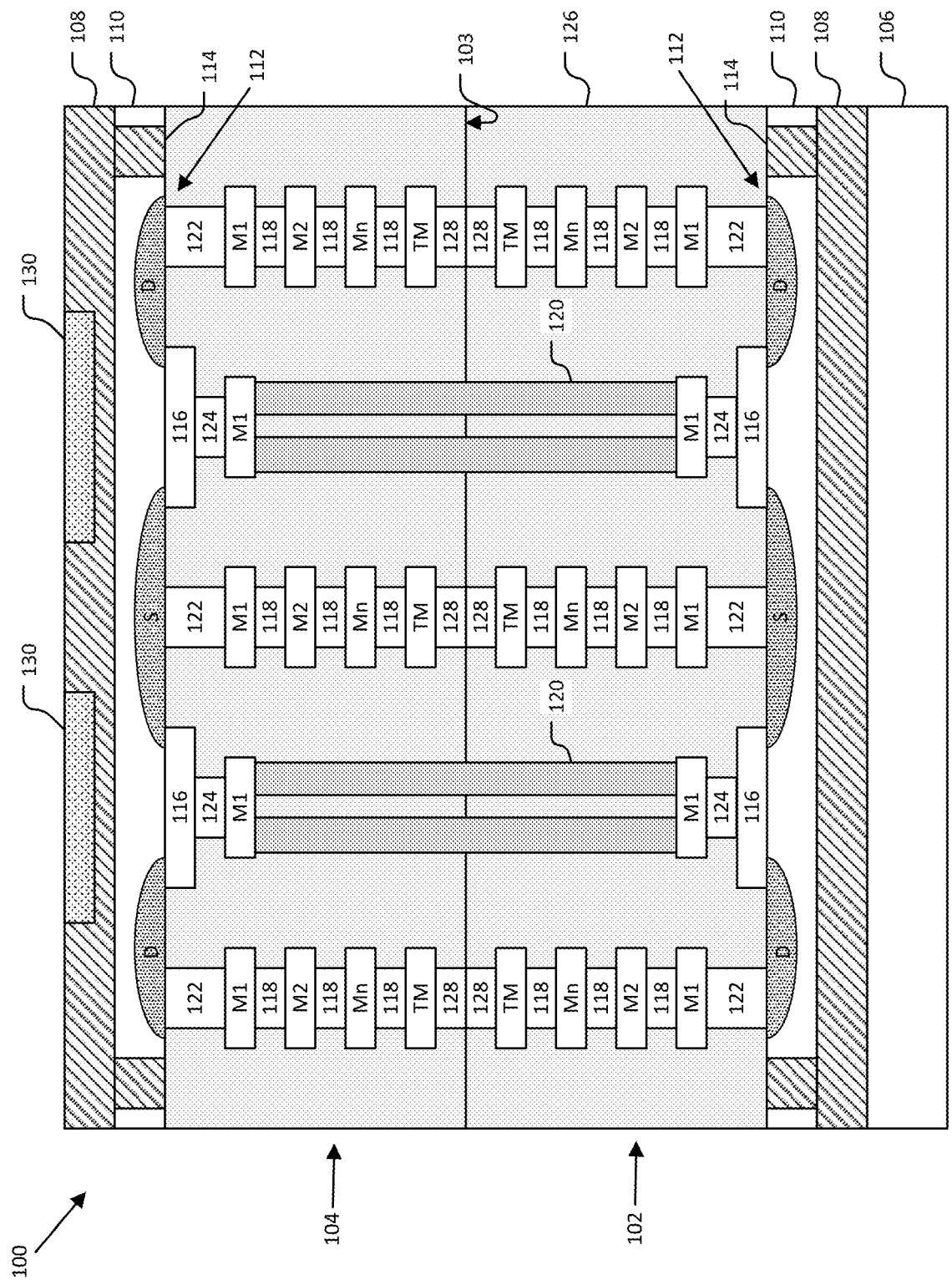
FIG. 1 illustrates a first embodiment of a semiconductor device with a heat sink comprising thermally conductive structures.

FIG. 1 illustrates an embodiment of a semiconductor device 100 with a set of thermally conductive structures 120 that extend through a portion of a lower substrate 102 and an upper substrate 104. In the embodiment of FIG. 1, each of the lower and upper substrates 102 and 104 is a silicon on insulator (SOI) substrate. The lower substrate 102 includes a bulk semiconductor layer 106, a buried oxide (BOX) layer 108, and a silicon device layer 110. Although no bulk substrate 106 is shown in the upper substrate 104 FIG. 1, a thickness of from 5 to 10 microns of bulk substrate may be present in some embodiments.

The semiconductor substrates are not limited to being SOI substrates. One or both of the substrates may be another type such as a silicon germanium substrate, a gallium nitride substrate, a silicon substrate, or another substrate material as known in the art. In addition, the upper and lower substrates 102 and 104 may have different semiconductor materials from one another. For example, in another embodiment, the lower substrate 102 is a silicon germanium substrate and the upper substrate 104 is a SOI substrate or a substrate including gallium nitride. Other variations are possible.

The SOI substrates of FIG. 1 include active regions 112 on which active devices are formed. The active region 112 includes active components or circuits, such as conductive features, implantation regions, resistors, capacitors, and other semiconductor elements, e.g., transistors, diodes, etc. The active region 112 is bounded by shallow trench isolation (STI) structures 114 on sides of the active region and is formed in a front-end-of-line (FEOL) process.

The active devices shown in the figure are transistors with gates 116 coupled to a source region S and a drain region D on opposite sides of the gate. The gates 116 may be conventional gates as known in the art, e.g. polysilicon gates separated from the source and drain regions by a gate dielectric material. In some applications, the transistors may be used for power amplifiers and operate at voltages of up to 10V or more. In other embodiments, the gates may be logic gates or switches for an RF device, for example. The gates may include one or more known gate material such as polysilicon or silicide, or a metal or metal composite such as W, WN, TiN, etc.

Also shown in FIG. 1 are metal lines of metal layers M1-Mn and a top metal layer TM, each corresponding to a back end of line (BEOL) metal layer. Each of the metal lines of metal layers M1-TM is coupled to a vertically adjacent metal line by a via 118, which may be interlayer dielectric vias (IDV) or interconnect vias (IV). Vias 118 are formed by etching via holes using conventional mask patterning and etch processes as known in the art and depositing a conductive material in the via holes. The metal lines and vias 118 may include conductive materials typically used in BEOL processes, such as Cu, Al, W, Ti, TiN, Ta, TaN, or multiple layers or combinations thereof.

The metal layers are coupled to structures in the active region 112 by contacts 122. The contacts are formed in a frond end of line (FEOL) process using conventional contact materials. For example, the contacts 122 and 124 may include a tungsten material and a titanium nitride barrier liner layer along the sidewalls and bottoms of the contacts. Other materials and combinations of materials are possible as known in the art.

The conductive structures in the substrates are surrounded by an insulating material 126 which is a dielectric material. In some embodiments, the insulating material 126 is made of silicon oxide, although other materials are possible. In some embodiments, the insulating material 126 includes multiple dielectric layers of dielectric materials. One or more of the multiple dielectric layers may be made of low dielectric constant (low-k) materials.

Conductive structures of the two substrates 102 and 104 are electrically coupled to one another by metal bond pads 128 located at the interface 103 between the substrates. The bond pads 128 are contact pads on the faces of the substrates, and they may be bonded to one another using a hybrid bonding process. The metal of bond pads 128 may be copper, aluminum, or other metal materials appropriate for hybrid bonding as known in the art. In an embodiment, one or more of the bond pads 128 may be a bonding via without the pad to make the direct wafer-to-wafer metal connection. The bond pads 128 may be lined with a barrier liner as known in the art. Examples of barrier materials that may be used for the barrier liner are nitride materials such as TiN and TaN.

In the embodiment of FIG. 1, two thermally conductive structures 120 are vertically aligned with gates 116 of the first and second substrates 102 and 104. The thermally conductive structures 120 may be vertically aligned with the gates 116 or with gate regions, e.g. transistor regions, or the area between source and drain regions of a transistor. The thermally conductive structures 120 extend through a portion of the insulating material 126 of the lower substrate 102 and a portion of the insulating material of the upper substrate 104. The thermally conductive structures 120 are thermally coupled to and electrically insulated from metal lines of metal layer M1, which in turn are electrically coupled to each gate 116 by a gate contact 124. The thermally conductive structures 120 are electrically insulated from the electrically active structures in the semiconductor device 100, including the active structures of active region 112 and the metal lines and vias in the BEOL layers.

The electrical insulation may be provided by a dielectric material that lines openings in which the thermally conductive structures 120 are formed. In some embodiments, a layer of electrically insulating material such as a silicon oxide or nitride material may be provided locally between the thermally conductive structures 120 and a metal element to which the thermally conductive structures are thermally coupled. In some embodiments, the electrical insulation is provided by a material of the thermally conductive structures 120, for example when the structures are formed of diamond.

The thermally conductive structures 120 are formed of a thermally conductive material. In various embodiments, the thermally conductive material may have a thermal conductivity value of at least 50 W/mK, at least 100 W/mK, at least 200 W/mK, at least 300 W/mK, or at least 350 W/mK. Examples of the thermally conductive material of the thermally conductive structures 120 are carbon-based materials such as diamond and metal-based materials such as copper, aluminum and tantalum. When a metal-based material such as copper is used in the thermally conductive structures 120, the structures may be lined with a diffusion barrier material such as tantalum nitride.

The thermally conductive structures 120 may act as heat sinks within the semiconductor device 100 by allowing heat to flow from the active region 112 into the interior of the device structure and dissipate through the device, resulting in a more even temperature distribution and reducing heat concentration around the active region. In addition, the thermally conductive structures 120 can move heat from the active region 112 of the lower substrate 102 towards the upper substrate 104 which may be thinner than the lower substrate 102. In the embodiment of FIG. 1, the lower substrate 102 is substantially thicker than the upper substrate 104 due to the presence of a full thickness bulk substrate 106. Accordingly, heat may dissipate more readily from the upper substrate 104 than the lower substrate 102. Embodiments are not limited to having a thinner upper substrate 104 than the lower substrate 102, and the thermally conductive structures 120 may be implemented in a device 100 with symmetrical substrate thicknesses.

In addition, the upper substrate 104 may include one or more thermally conductive contact 130, which may also be referred to as a backside contact 130. The backside contact 130 may include a thermally conductive material such as the thermally conductive materials described above with respect to the thermally conductive structures 120, except that when the backside contact 130 is located in an electrically insulating material such as buried oxide layer 108, it is not necessary to provide a barrier material lining for a copper contact. The thermally conductive structures 120 may convey heat from the active region 112 of the lower substrate 102 towards one or more backside contact 130 which conveys the heat outside of the semiconductor device 100.

In an embodiment, semiconductor device 100 only has a single backside contact 130 which may extend over a substantial portion of the surface of the device. Alternatively, the device 100 may have a plurality of backside contacts 130 vertically aligned with heat-generating areas of the device and/or thermally conductive structures 120. The thickness of the backside contacts 130 may be from around 0.5 microns to as much as 60 microns depending on the capabilities of the facility where the contacts are formed and the desired performance characteristics. Characteristics of the backside contacts 130 including their location, size, material, and electrical isolation result in a configuration that removes heat from the device 100.

The size and shape of the thermally conductive structures 120 is not particularly limited. In some embodiments, the thermally conductive structures 120 have a pillar shape, but horizontally elongated shapes are possible. The thermally conductive structures 120 may have a minimum width or diameter of from 0.1 to 0.5 microns, for example. Smaller sizes provide less thermal conductivity, while larger sizes tend to have a longer processing time. The specific size of the thermally conductive structures 120 may be selected based on the desired thermal regulation characteristics and the configuration of the device 100. When thermally conductive structures 120 are adjacent to one another as shown in FIG. 1, they may be spaced apart by a distance of about 0.1 to 0.5 microns, for example.

Figure 2:
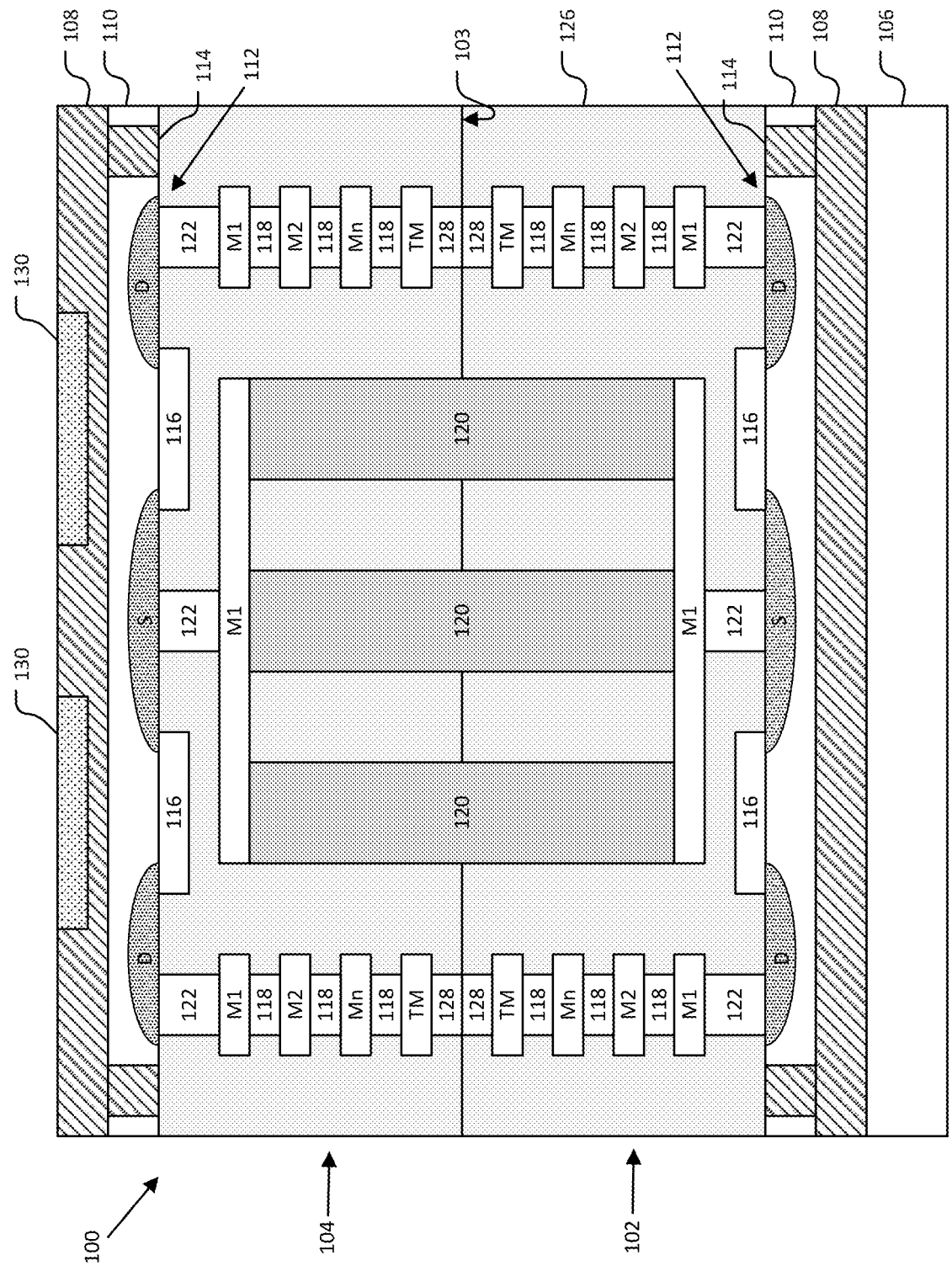
FIG. 2 illustrates a second embodiment of a semiconductor device with a heat sink comprising thermally conductive structures.

The number and location of thermally conductive structures 120 may vary between different embodiments. For example, FIG. 2 shows an embodiment in which three thermally conductive structures 120 are coupled to the same metal line of metal layer M1 that extends over two gates 116. In other embodiments, thermally conductive structures 120 may be thermally coupled to a metal line that extends over three or more gates.

Another difference between the embodiment of FIG. 2 compared to the embodiment of FIG. 1 is that the metal line to which the thermally conductive structures 120 are thermally coupled is in turn coupled to the active regions 112 through contacts 122 for the source regions S. In various embodiments, the metal line to which the thermally conductive structures 120 are thermally coupled may connect to various structures in the active region 112. While it is advantageous to provide a thermal path between the thermally conductive structures 120 and conductive structures of the active region 112, it is not necessary to do so: for example, the thermally conductive structures 120 can provide a thermal benefit even when coupled to a floating metal line or spaced apart from metal structures in the device.

Figure 3:
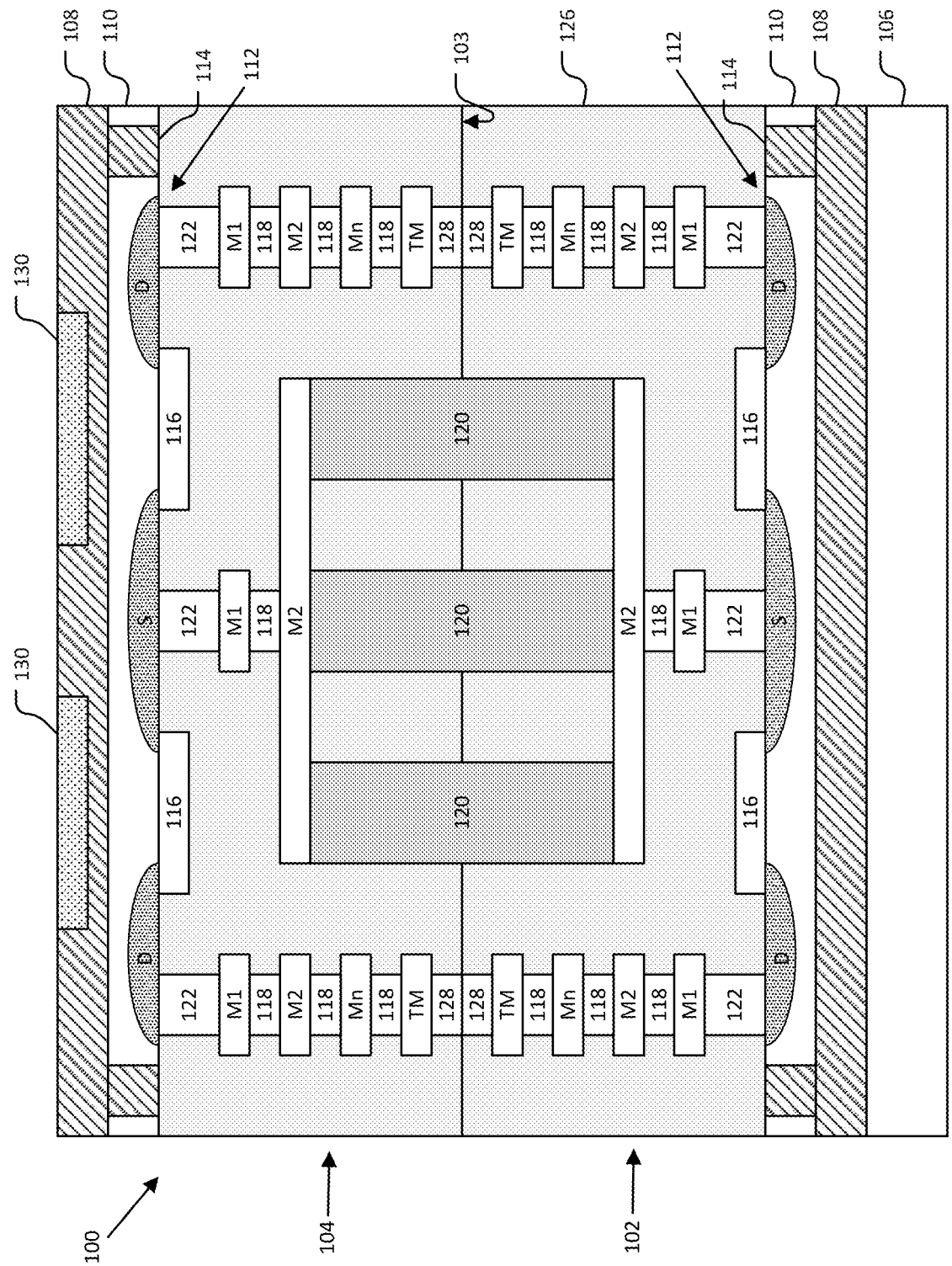
FIG. 3 illustrates a third embodiment of a semiconductor device with a heat sink comprising thermally conductive structures.

FIG. 3 illustrates a third embodiment in which the thermally conductive structures 120 are thermally coupled to a metal line of the second metal layer M2. In various embodiments, the thermally conductive structures 120 may terminate at a level corresponding to any of the BEOL metal layers on either of the lower and upper substrates 102 and 104. Various termination depths may be implemented, for example, to accommodate a high density of metal interconnect structures in certain devices 100 or certain areas of a device. In some embodiments, the thermally conductive structures 120 extend to different depths in different regions of a device 100.

Figure 4:
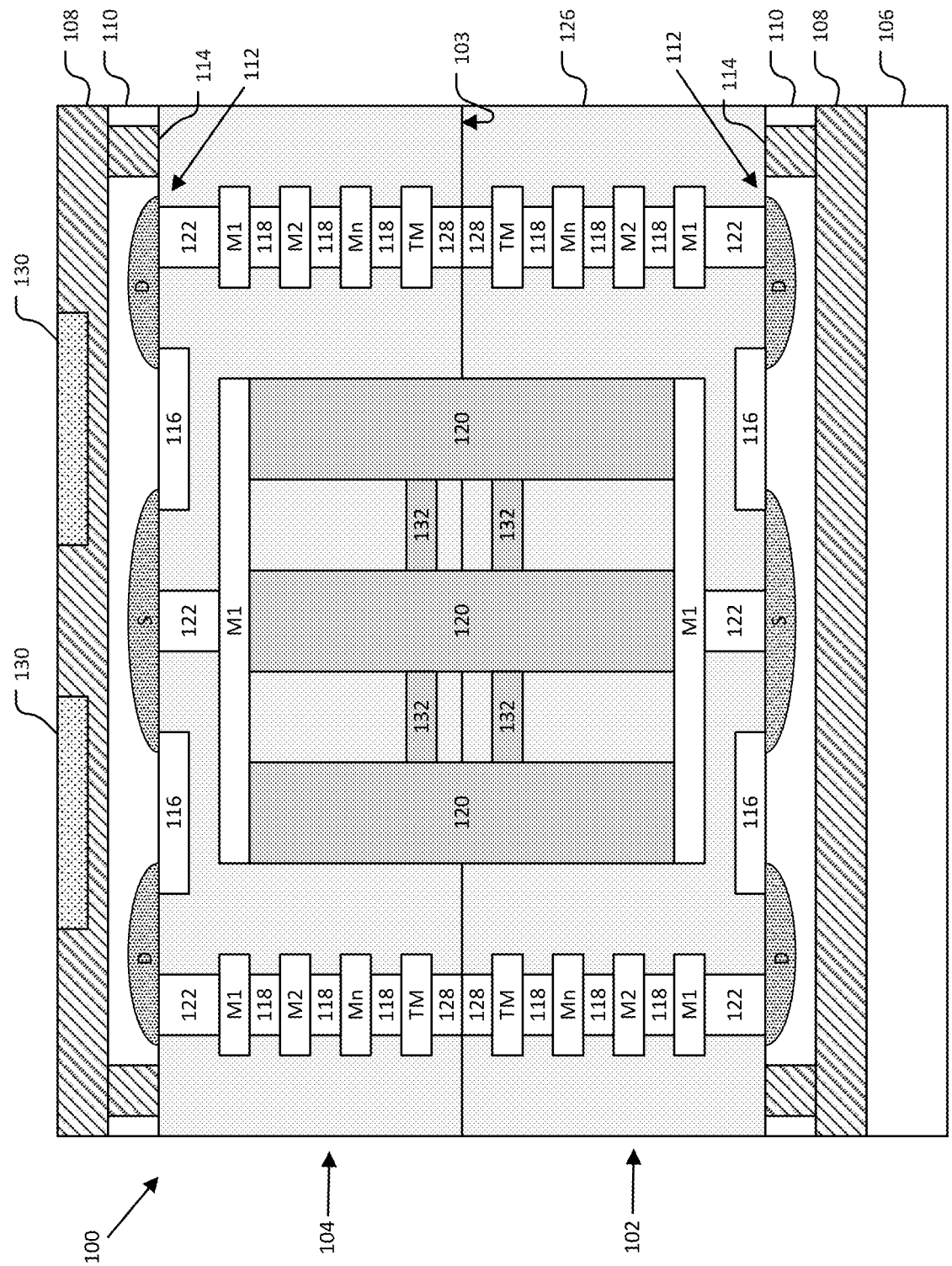
FIG. 4 illustrates a fourth embodiment of a semiconductor device with a heat sink comprising thermally conductive structures with lateral components.

FIG. 4 illustrates a fourth embodiment in which the thermally conductive structures 120 are thermally coupled to one another by lateral conductive structures 132. The lateral conductive structures 132 may have the same depth of a metal line, and trenches for the lateral conductive structures may be formed at the same processing step as forming the metal lines at the same metal level. The lateral conductive structures 132 may be formed of the same thermally conductive material as the thermally conductive structures 120, or the same metal as the metal lines. While FIG. 4 shows two sets of lateral conductive structures 132, one in the lower substrate 102 and one in the upper substrate 104, additional sets of lateral conductive structures 132 may be present at multiple vertical levels of the device. Lateral conductive structures 132 may be present at any BEOL metal level of the device 100.

Figure 5:
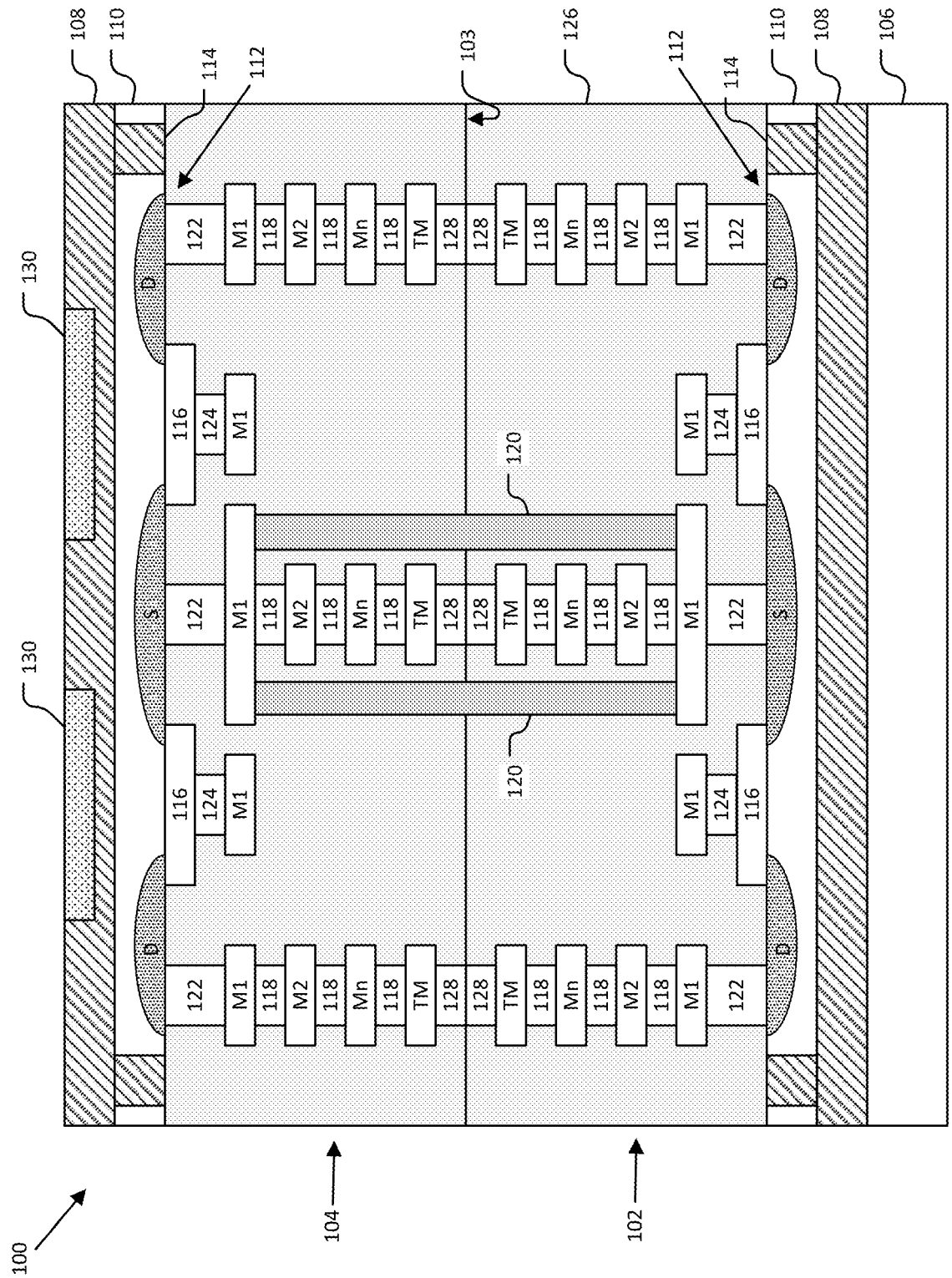
FIG. 5 illustrates a fifth embodiment of a semiconductor device with a heat sink comprising thermally conductive structures.

FIG. 5 illustrates a fifth embodiment in which the thermally conductive structures 120 are thermally coupled to the same metal line of metal layer M1 that is coupled to the source region between gates 116. The fifth embodiment demonstrates that the thermally conductive structures 120 are not limited to being adjacent to one another and can be spaced apart by various electrically conductive structures of the device 100. In some embodiments, only one thermally conductive structure 120 is present in the vertical region above each gate 116 (or similar heat producing structure). In view of this and the other embodiments illustrated above, it should be appreciated that thermally conductive structures 120 within the scope of this disclosure may be implemented in a variety of different depths, sizes and locations within a device 100.

Figure 6:
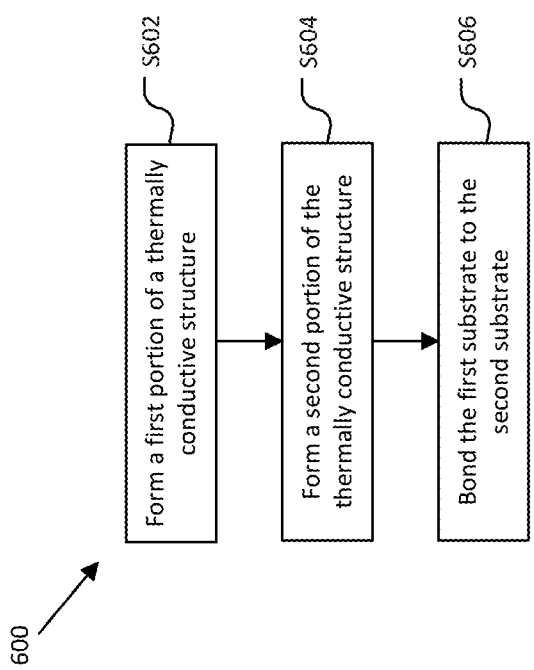
FIG. 6 illustrates an embodiment of a method for forming a semiconductor device with a heat sink comprising thermally conductive structures.

FIG. 6 illustrates an example of a process 600 that may be performed to form a semiconductor device 100 as described above. A first portion of a thermally conductive structure 120 is formed in a first substrate, e.g. a lower substrate 102 or an upper substrate 104, at S602. The substrate may have an active region formed using FEOL processes and metallization structures formed over the active region using BEOL processes. When the semiconductor device includes a lateral conductive structure 132 in a BEOL region, the lateral conductive structure 132 may be formed while forming the BEOL level on which the lateral structure is located. The lateral conductive structure 132 may be formed using typical etch and deposition processes as known in the art.

After the interlayer insulating layer has been formed to the top metal layer TM, the first portion of the thermally conductive structure 120 is formed by etching an opening in the insulating material 126. When the thermally conductive structure 120 is coupled to a metal line, the metal line or an electrically insulating material over the metal line may be used as an etch stop layer.

When the thermally conductive structure 120 includes one or more liner material, the liner material is deposited into the opening. The one or more liner material may include, for example, a diffusion barrier material, an adhesion layer, and an electrically insulating layer.

Next, a thermally conductive material is deposited over the first substrate to fill the opening. The thermally conductive material may be a material with a thermal conductivity of at least 50 W/mK, specific examples of which are described above. When the material is copper, the copper of the thermally conductive structure 120 may be deposited at the same time as copper vias or bond pads 128. Alternatively, the conductive material of the thermally conductive structure 120 may be formed in a separate step. One or more planarization process such as chemical mechanical polishing (CMP) is performed to remove the thermally conductive material from the surface of the first substrate and to prepare the surface of the first substrate for bonding.

A second portion of the thermally conductive structure 120 is formed in a second substrate, e.g. a lower substrate 102 or an upper substrate 104, at S604. The second portion of the thermally conductive substrate 120 may be performed in essentially the same fashion as the first portion described above with respect to S602.

The first substrate including the first portion of the thermally conductive structure 120 is bonded to the second substrate including the second portion of the thermally conductive structure 120 at S606. The substrates may be bonded to one another using a hybrid bonding process, which may be performed by bonding wafers including respective sets of first and substrates. The hybrid bonding process may result in a gap on the order of a few angstroms between the first portion and the second portion of the thermally conductive structure 120. Such a miniscule gap has a negligible effect on the thermal conductivity of the final thermally conductive structure 120.

The at least one thermally conductive structure 120 according to embodiments of the present disclosure provides significant advantages to a semiconductor device 100. In some embodiments, the amount of heat concentrated at the active region 112 of a device may be reduced by more than 10%, more than 50%, more than 75%, or more than 90% for at least one of the bonded substrates compared to an ambient temperature of a bulk substrate 106. The heat concentration may be reduced by dissipating heat through the BEOL regions of the respective substrates.

Thermal performance of the device may be enhanced by positioning thermally conductive structures 120 over heat generating structures of the device such as gates, thermally coupling the thermally conductive structures to metal lines that are electrically coupled to the heat generating structures, providing at least one backside contact 130 that transfers heat away from the device, and by aligning the thermally conductive structures with the one or more backside contact. Various embodiments may employ one or more of these strategies to mitigate heat buildup within a device.

Aspects of the present disclosure have been described in conjunction with the specific embodiments thereof that are proposed as examples. Numerous alternatives, modifications, and variations to the embodiments as set forth herein may be made without departing from the scope of the claims set forth below. Accordingly, embodiments as set forth herein are intended to be illustrative and not limiting.

The invention claimed is:

1. A semiconductor device comprising:
   a first substrate;
   a second substrate bonded to the first substrate; and
   at least one thermally conductive structure that extends through a portion of the first substrate and a portion of the second substrate and is vertically aligned with an active region of the first substrate,
   wherein the at least one thermally conductive structure is electrically insulated from electrically active structures in the semiconductor device, and
   wherein the at least one thermally conductive structure is thermally coupled between a BEOL metal line of the first substrate and a BEOL metal line of the second substrate.

2. The semiconductor device of claim 1, wherein the BEOL metal line of the first substrate is at metal level M1.

3. The semiconductor device of claim 1, wherein the at least one thermally conductive structure is vertically aligned with a gate region of the first substrate.

4. The semiconductor device of claim 1, wherein the at least one thermally conductive structure includes a first thermally conductive structure and a second thermally conductive structure, the semiconductor device further comprising:
   at least one lateral thermally conductive structure thermally coupled between the first thermally conductive structure and the second thermally conductive structure.

5. The semiconductor device of claim 1, wherein the at least one thermally conductive structure is a pillar with a diameter of from 0.1 to 0.5 microns.

6. The semiconductor device of claim 1, further comprising:
   a thermally conductive contact on a backside of the second substrate and configured to remove heat from the semiconductor device.

7. The semiconductor device of claim 6, wherein the at least one thermally conductive structure is vertically aligned with the thermally conductive contact.

8. The semiconductor device of claim 1, wherein the first substrate comprises a silicon on insulator layer or a silicon germanium substrate layer, and the second substrate comprises a silicon on insulator layer or a gallium nitride layer.

9. The semiconductor device of claim 1, wherein the at least one thermally conductive structure is formed of a copper material or a diamond material.

10. The semiconductor device of claim 1, wherein the thermally conductive structure has a thermal conductivity of at least 50 W/mK.

11. The semiconductor device of claim 1, wherein the at least one thermally conductive structure is thermally coupled to a gate on the first substrate.

12. A heat sink for a semiconductor device, the heat sink comprising:
   at least one thermally conductive structure that extends through a portion of a first substrate and a portion of a second substrate and is vertically aligned with an active region of the first substrate,
   wherein the at least one thermally conductive structure is electrically insulated from electrically active structures in the semiconductor device, and
   wherein the at least one thermally conductive structure is thermally coupled between a BEOL metal line of the first substrate and a BEOL metal line of the second substrate.

13. The heat sink of claim 12, wherein the at least one thermally conductive structure is a pillar with a diameter of from 0.1 to 0.5 microns.

14. The heat sink of claim 12, wherein the at least one thermally conductive structure includes a first thermally conductive structure and a second thermally conductive structure, the heat sink further comprising:
   at least one lateral thermally conductive structure thermally coupled between the first thermally conductive structure and the second thermally conductive structure.

15. The heat sink of claim 12, wherein the at least one thermally conductive structure is thermally coupled to a gate of the first substrate.

16. A method of forming a semiconductor device, the method comprising:
   forming a first portion of at least one thermally conductive structure in a first substrate;
   forming a second portion of the at least one thermally conductive structure in second substrate; and
   bonding the first substrate to the second substrate so that the first portion of the at least one thermally conductive structure is thermally coupled to the second portion of the at least one thermally conductive structure,
   wherein the at least one thermally conductive structure that extends through a portion of the first substrate and a portion of the second substrate and is vertically aligned with an active region of the first substrate, wherein the at least one thermally conductive structure is electrically insulated from electrically active structures in the semiconductor device, and wherein the at least one thermally conductive structure is thermally coupled between a BEOL metal line of the first substrate and a BEOL metal line of the second substrate.

17. The method of claim 16, wherein the bonding is performed by hybrid bonding the first substrate to the second substrate.

* * * * *